US006852636B1

United States Patent
O'Donnell

(10) Patent No.: US 6,852,636 B1
(45) Date of Patent: Feb. 8, 2005

(54) INSITU POST ETCH PROCESS TO REMOVE REMAINING PHOTORESIST AND RESIDUAL SIDEWALL PASSIVATION

(75) Inventor: Robert J. O'Donnell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/472,757

(22) Filed: Dec. 27, 1999

(51) Int. Cl.[7] .................. H01L 21/302; H01L 21/3065
(52) U.S. Cl. .................. 438/706; 438/710; 438/712; 438/720
(58) Field of Search .................. 438/706, 710, 438/712, 720

(56) References Cited

U.S. PATENT DOCUMENTS

| | | | |
|---|---|---|---|
| 4,804,431 A | 2/1989 | Ribner | 156/345 |
| 5,174,856 A | 12/1992 | Hwang et al. | 156/643 |
| 5,186,718 A * | 2/1993 | Tepman et al. | 29/25.01 |
| 5,198,634 A | 3/1993 | Mattson et al. | 219/121.43 |
| 5,462,892 A | 10/1995 | Gabriel | 437/189 |
| 5,705,443 A | 1/1998 | Stauf et al. | 438/722 |
| 5,712,207 A | 1/1998 | Lee et al. | 438/627 |
| 5,744,395 A | 4/1998 | Shue et al. | 438/305 |
| 5,770,100 A | 6/1998 | Fukuyama et al. | 216/69 |
| 5,776,832 A | 7/1998 | Hsieh et al. | 438/669 |
| 5,779,929 A | 7/1998 | Kim et al. | 216/100 |
| 5,780,359 A * | 7/1998 | Brown et al. | 438/659 |
| 5,795,831 A | 8/1998 | Nakayama et al. | 438/714 |
| 5,818,085 A | 10/1998 | Hsu et al. | 257/347 |
| 5,824,604 A | 10/1998 | Bar-Gadda | 438/725 |
| 5,846,884 A | 12/1998 | Naeem et al. | 438/714 |
| 5,849,639 A | 12/1998 | Molloy et al. | 438/714 |
| 5,882,489 A | 3/1999 | Bersin et al. | 204/192.35 |
| 5,899,716 A | 5/1999 | Tseng | 438/254 |
| 5,908,319 A | 6/1999 | Xu et al. | 438/725 |
| 5,922,503 A | 7/1999 | Spak et al. | 430/270.16 |
| 5,931,721 A | 8/1999 | Rose et al. | 451/89 |
| 5,946,589 A | 8/1999 | Ng et al. | 438/586 |
| 5,964,949 A | 10/1999 | Savas | 118/723 I |

FOREIGN PATENT DOCUMENTS

| | | | |
|---|---|---|---|
| EP | 0387097 A1 | 9/1990 | H01L/21/321 |
| EP | 0489179 A1 | 6/1992 | H01L/21/302 |
| WO | WO 97/11482 | 3/1997 | |

OTHER PUBLICATIONS

Lam Research Corp., Wafer Demonstration Report for Microchip Technology 5864/5865, 9/99.
PCT International Search Report, US/ISA, International Application No. PCT/US 00/35165, Washington, D.C., May 14, 2001.

* cited by examiner

Primary Examiner—Nadine G. Norton
Assistant Examiner—Lynette T. Umez-Eronini
(74) Attorney, Agent, or Firm—Beyer Weaver & Thomas, LLP

(57) ABSTRACT

A method for performing a metallic etch, etch mask stripping, and removal of residual sidewall passivation in a single etch chamber. A wafer is placed in an etch chamber. A metal etch is performed on the wafer. A stripping gas, such as a mixture of oxygen and argon is provided to the etch chamber and is energized to form an oxygen plasma. The oxygen plasma strips the etch mask from the wafer and removes residual sidewall passivation. The oxygen plasma also cleans the etch chamber.

16 Claims, 5 Drawing Sheets

INSITU POST ETCH PROCESS TO REMOVE REMAINING PHOTORESIST AND RESIDUAL SIDEWALL PASSIVATION

BACKGROUND OF THE INVENTION

The present invention relates to the manufacture of semiconductor devices. More particularly, the present invention relates to improved techniques for metallic etching and stripping remaining photoresist and residual sidewall passivation.

In the manufacture of certain types of semiconductor devices, such as a semiconductor device that uses aluminum interconnects, a metallic layer such as aluminum or titanium is etched in a metal etching device leaving residual sidewall passivation and remaining photoresist.

To facilitate discussion, FIG. 1 is a schematic view of a prior art etch tool 10, which comprises a load lock 12, a metal etch chamber 14, a strip chamber 16, and a cooling station 18.

A semiconductor wafer, which has a metallic layer disposed below an etch mask (such as a photoresist mask or hardmask), is placed in the load lock 12, which allows the semiconductor wafer to enter the etch tool 10 while maintaining a vacuum in the etch tool 10. In this example, the etch mask is a photoresist mask. From the load lock 12 the wafer is transferred to the metal etch chamber 14, which is dedicated to providing a metal etch. Such etching chambers, such as reactive ion etch chambers, typically generate a plasma to allow etching. The etch chamber 14, for example, uses $Cl_2$ and $BCl_3$ (boron trichloride) as the etchant gases during the metal etch. Additives such as $N_2$, or $CHF_3$ may also be added depending upon the nature of the etching.

In some prior art reactive ion metal etch chambers 14, an electrode adjacent to the wafer is biased to create a potential across the wafer to electrostatically attract the plasma to the wafer, which enhances etching. Such etch chambers also tend to have interior pressures on the order of 1 to 20 millitorr (mT). The plasma etches away parts of the metallic layer not protected by the etch mask to form metallic interconnections. The etching process creates residual sidewall passivation formed from redeposited etch products.

The semiconductor wafer may then be transferred from the etch chamber 14 to the strip chamber 16. The strip chamber 16 may be a downstream plasma device, which generates a plasma remotely from the wafer and subjects the semiconductor wafer to ions generated from the plasma. The strip chamber 16 also tends to operate at pressures on the order of 1 torr, which is generally much higher than the pressure in the metal etch chamber 14. The strip chamber 16 removes the photoresist mask. In the prior art, some strip chambers also provide corrosion passivation by exposing the wafer to a water vapor plasma to provide corrosion protection.

FIG. 2 is a cross-sectional view of part of a semiconductor wafer 22, which forms a substrate, after an aluminum layer has been etched to form aluminum interconnects 23 and after the semiconductor wafer 22 has been subjected to an etch mask strip and corrosion passivation. Redeposited etched metal residue is deposited on the sides of the aluminum interconnects 23 and the photoresist mask to form residual sidewall passivation 25. For aluminum interconnects, the residual sidewall passivation may be formed from redeposited etch residue, which may be aluminum in the form of a chloride or fluoride. When the aluminum residue is exposed to oxygen, aluminum oxide is formed, which tends to be difficult to remove in a conventional strip chamber. After the photoresist mask is stripped, part of the residual sidewall passivation 25 that was adjacent to the photoresist mask may remain, forming "bat ears" 26. In other processes, the "bat ears" may be so thin that they fall over forming "veils".

Because the residual sidewall passivation 25 is significantly composed of inorganic material such as aluminum or titanium, the strip chamber 16 may not, in many cases, be able to remove the residual sidewall passivation 25.

The semiconductor wafer 22 may then be transferred from the strip chamber 16 to the cooling station 18, where the semiconductor wafer 22 is cooled. The semiconductor wafer 22 may then be transferred from the cooling station 18 back to the load lock 12, so that the semiconductor wafer 22 may be removed from the etch tool 10, while preserving the vacuum in the etch tool 10. The semiconductor wafer 22 may be transferred from the etch tool 10 to a wet chemical bath 20 where the wafer may be subjected to aggressive chemicals to remove some of the residual sidewall passivation 25. EKC 265 and ACT 935 are examples of chemicals that are used in a wet chemical bath to strip residual sidewall passivation.

Wet chemical baths tend to be expensive to maintain. The consumed chemicals and environmental considerations in handling and disposing the chemicals also increase the cost of the chemical baths. As the amount of residue that is removed increases, the amount of chemicals consumed also increases.

Current etch tools, such as the TCP™ 9600PTX Metal Etch System available from LAM Research Corp. of Fremont, Calif., combine two inductively coupled plasma etch chambers with two microwave strip chambers. Each etch chamber requires a plasma source and each strip chamber requires a plasma source, which increases the cost and complexity of the etch tool. In the TCP™ 9600PTX Metal Etch System it is recommended that in the strip chamber the strip process be for 60 seconds for an oxygen nitrogen strip and the water vapor plasma corrosion passivation be for 30 seconds for a total process time of 90 seconds in the strip chamber.

The processing time in the etch tool and the wet chemical bath in the prior art comprises the sum of the etch time in the etch chamber, the etch mask strip time in the strip chamber, the corrosion passivation time in the strip chamber, transfer time between the etch chamber and the strip chamber, and time of residual sidewall passivation removal in the wet chemical bath. The transfer times between the two etch chambers and the two strip chambers increase processing time. In the prior art the time of residual sidewall passivation removal in the wet chemical bath could be about 20 minutes.

Since $BCl_3$ reacts with oxygen to create a non-volatile residue, which will contaminate the etch chamber, it was typically thought to be desirable to keep oxygen out of an etch chamber that uses $BCl_3$.

In view of the foregoing, it is desirable to provide an improved removal of residual sidewall passivation. It is also desirable to provide a less expensive etch tool. It is also desirable to increase the throughput of an etch tool.

SUMMARY OF THE INVENTION

The invention relates, in one embodiment, to a method for etching the metal layer, stripping the etch mask of an organic material, and removing the residual sidewall passivation in an etch chamber in an etch tool. Stripping the etch mask and removing sidewall passivation is accomplished in the etch chamber by an oxygen plasma or other stripping plasma in the etch chamber. The etch chamber may able to both strip the etch mask layer and remove residual sidewall passivation in about 30 seconds. Corrosion passivation is provided in a corrosion passivation chamber which exposes a wafer to water vapor in a high temperature environment.

The invention relates, in a second embodiment, to a method for etching at least partially through a metal-containing layer disposed above a substrate, wherein part of said metal-containing layer is disposed below an etch mask and part of said metal-containing layer is not disposed below the etch mask, comprising the steps of, placing the substrate in an etch chamber; flowing an etchant gas into the etch chamber; creating a plasma from the etchant gas in the etch chamber; etching away parts of the metal-containing layer not disposed below the etch mask and forming residual sidewall passivation; discontinuing the flow of the etchant gas; flowing an etch mask stripping gas into the etch chamber; creating a plasma from the etch mask stripping gas in the etch chamber; stripping away the etch mask and removing some residual sidewall passivation while the substrate is in the etch chamber; and removing the substrate from the etch chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
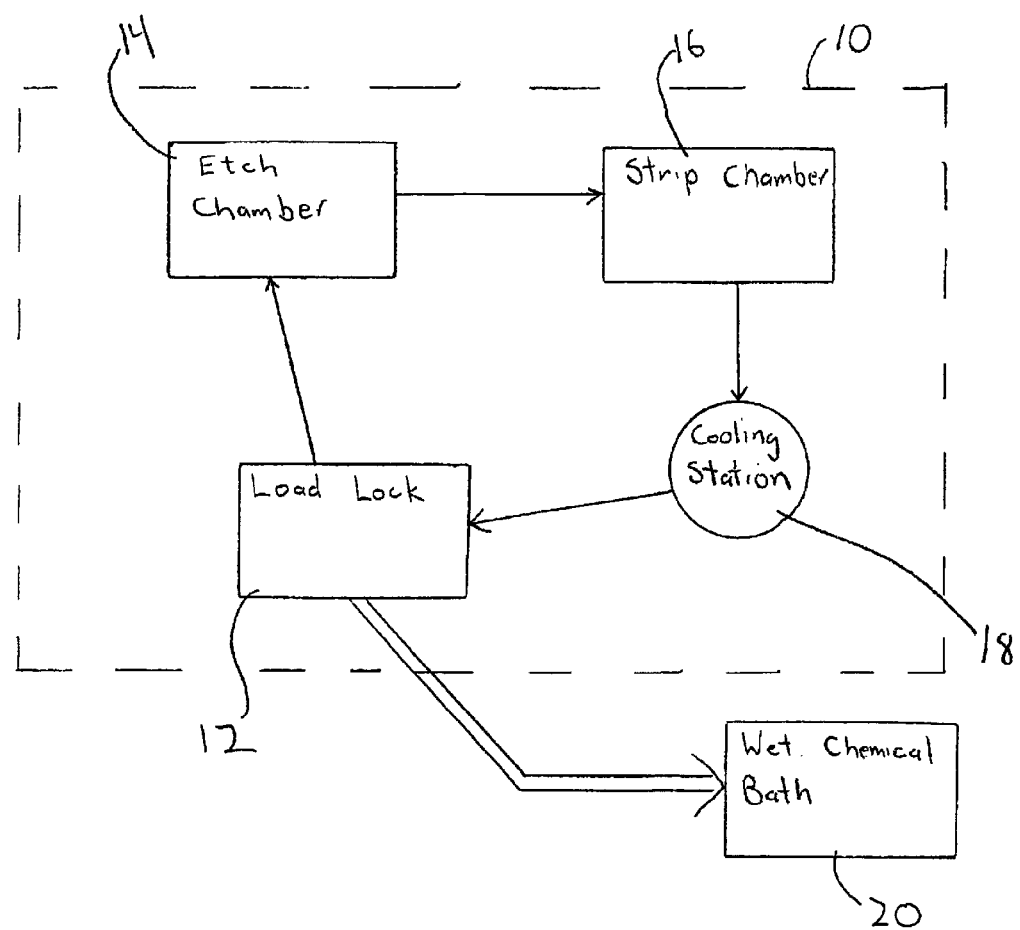
FIG. 1 is a schematic view of a prior art etch tool.
Figure 2:
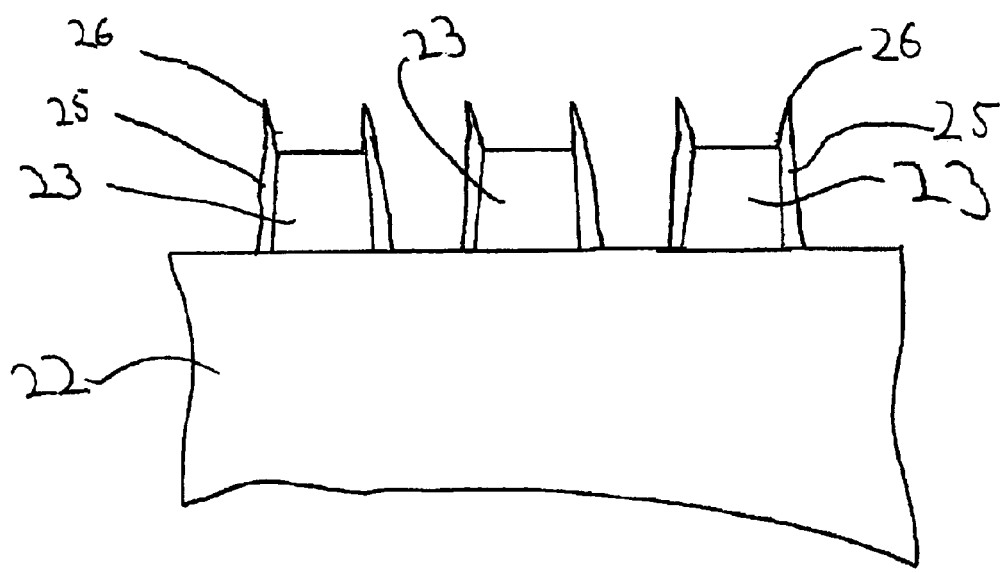
FIG. 2 is a cross-sectional view of part of a semiconductor wafer.
Figure 3:
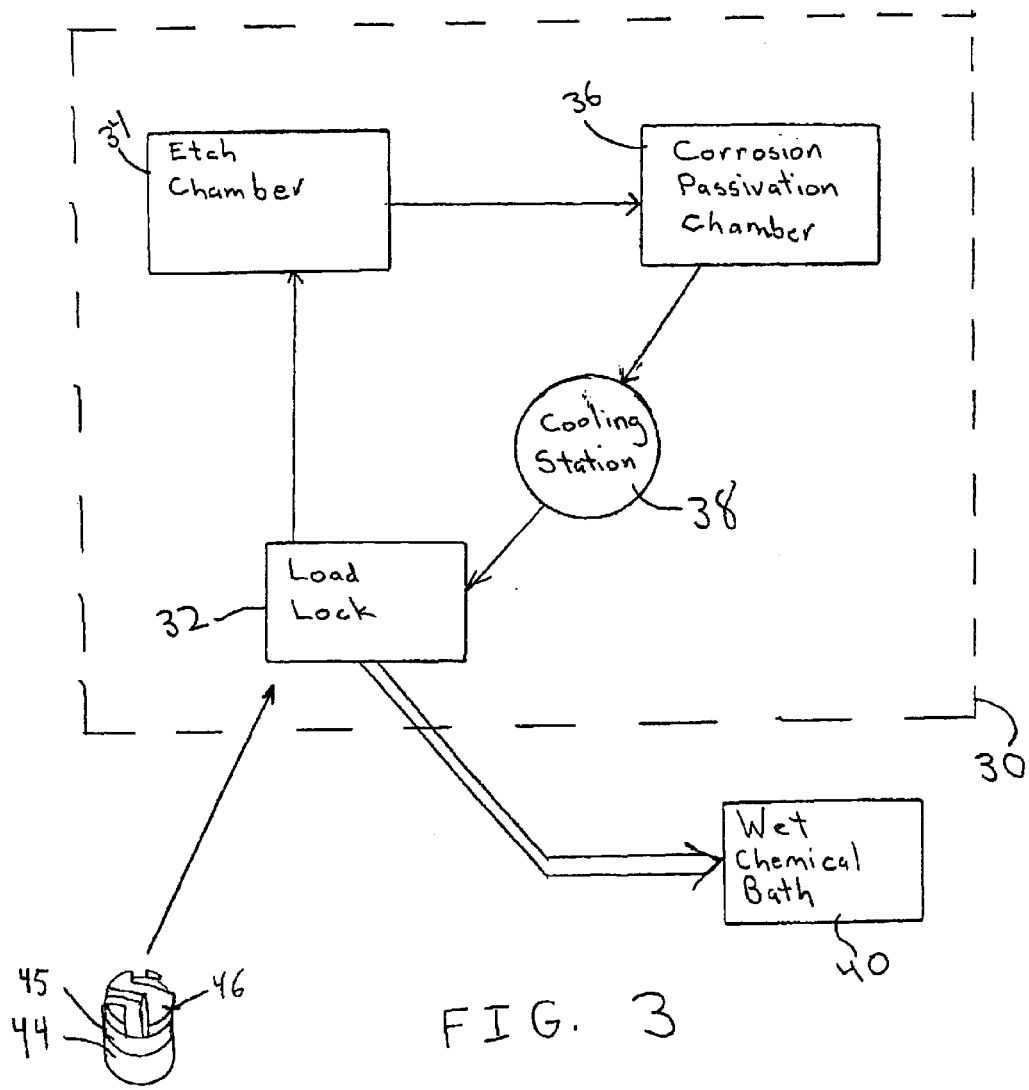
FIG. 3 is a schematic view of a preferred embodiment of the invention.
Figure 4A:
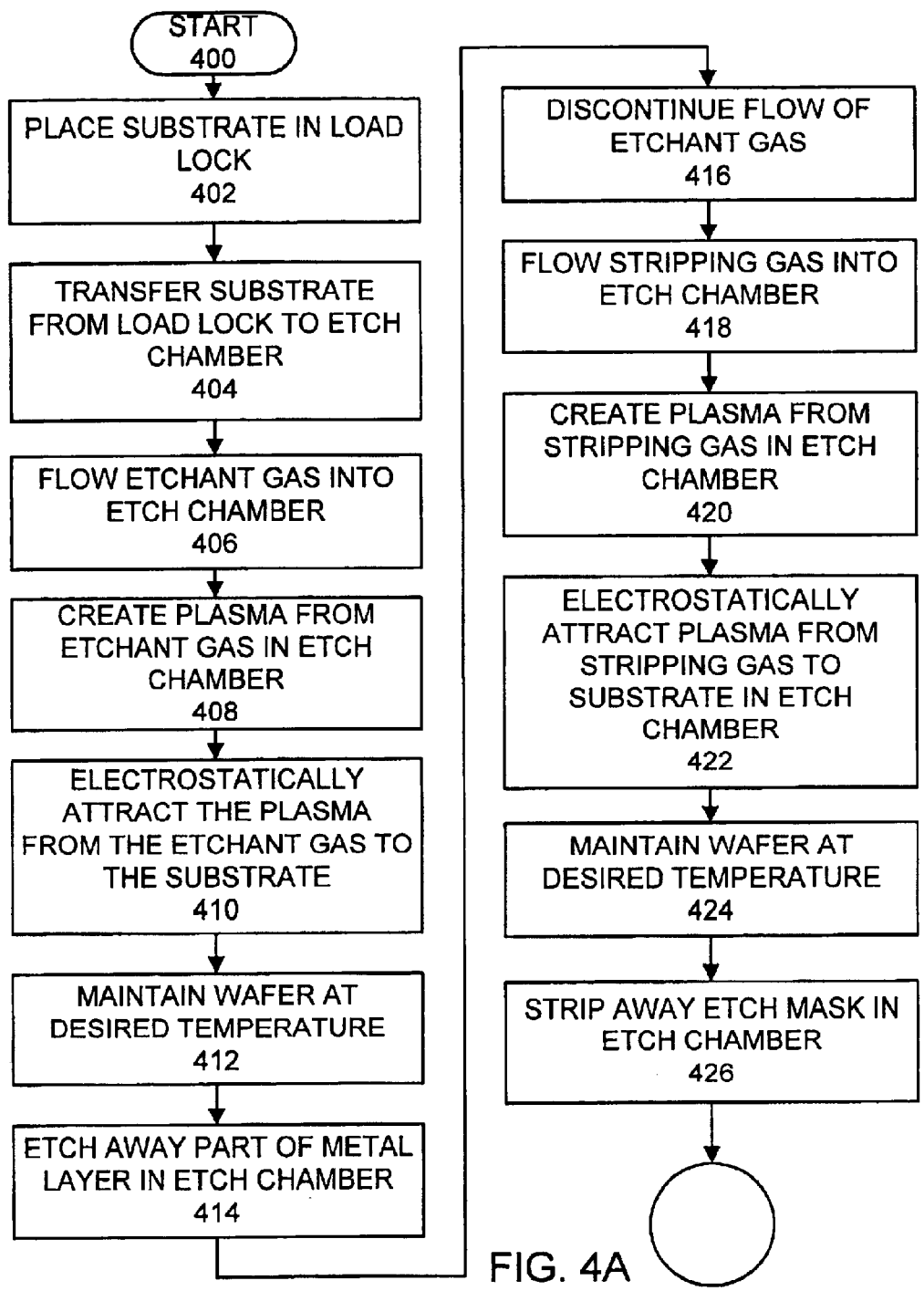
FIGS. 4A and 4B form a flow chart of the process used in the preferred embodiment of the invention.
Figure 4B:
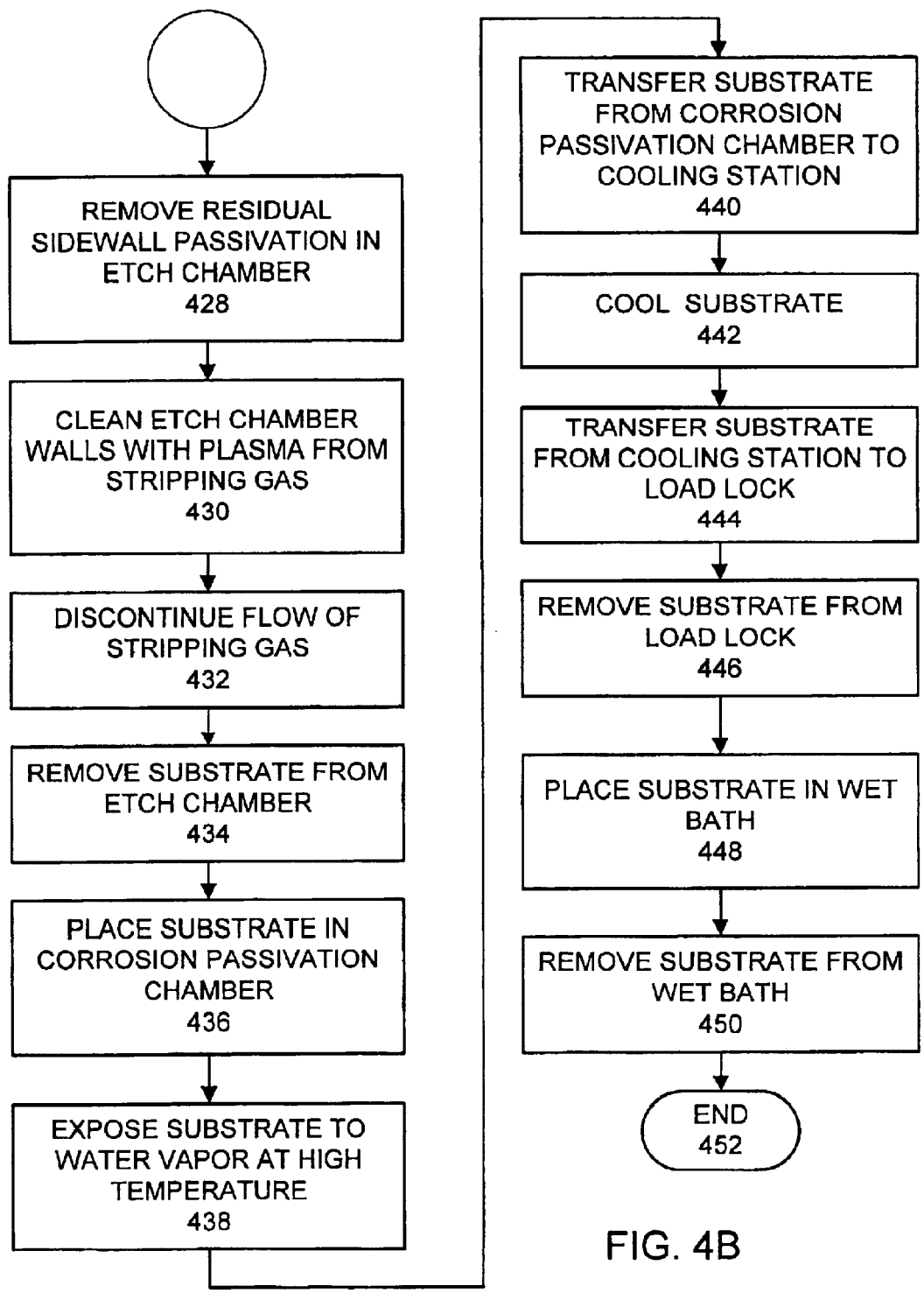

To facilitate discussion, FIG. 3 depicts a schematic view of the inventive etch tool 30, which comprises a load lock 32, an etch chamber 34, a corrosion passivation chamber 36, and a cooling station 38. FIGS. 4A and 4B form a flow chart of the process described below.

In the operation of the etch tool 30, a substrate 44 is placed in the load lock 32, which allows the semiconductor wafer to enter the etch tool 30 while maintaining a vacuum in the etch tool 30 (step 402). In the example shown in FIG. 3, the substrate 44 is a semiconductor wafer with a metal-containing layer 45 where parts of the metal-containing layer are disposed below an etch mask 46. From the load lock 32 the wafer is transferred to the metal etch chamber 34 (step 404). In the preferred embodiment the etch chamber 34 is a reactive ion etch chamber. Other embodiments of the invention may use other types of etch chambers that have a plasma generation device. In the preferred embodiment, the pressure in the etch chamber is maintained between 1 and 80 millitorr. More preferably, the pressure in the etch chamber is maintained between 1 and 40 millitorr. Most preferably, the pressure in the etch chamber is maintained between 5 and 20 millitorr. This is a lower pressure than the pressure maintained in many prior art stripping chambers.

During the etch cycle of the etch chamber 34, an etchant gas is flowed into the etch chamber 34 (step 406). In the preferred embodiment of the invention the etchant gas comprises $Cl_2$ and $BCl_3$ (boron trichloride). In other embodiments additives such as $N_2$ or $CHF_3$ may also be added depending upon the nature of the etching. The amount of the etchant gas used is known in the prior art.

Power is supplied to the etchant gas as radio frequency power, which is inductively coupled to the etchant gas to create the plasma (step 408). In the preferred embodiment, the power supplied to the etchant gas is between 300 and 3,000 watts. More preferably, the power supplied to the etchant gas is between 300 and 1,500 watts. Most preferably, the power supplied to the etchant gas is between 600 and 1,000 watts. Other embodiments use other methods to convert the etchant gas into a plasma, such as using microwave power or capacitive coupling.

A bias voltage is applied to a chuck that supports the substrate placing a potential across the wafer, thus electrostatically attracting the plasma created from the etchant gas to the wafer (step 410). In the preferred embodiment the bias voltage is between −10 and −1,000 volts. More preferably the bias voltage is between −25 and −600 volts. Most preferably the bias voltage is between −50 and −400 volts. Since the bias voltage is dependent on various factors, it is easier to measure a bias power. In the preferred embodiment of the invention, the bias power is between 10 and 800 watts. More preferably the bias power is between 25 and 500 watts. Most preferably the bias power is between 50 and 250 watts.

The wafer temperature is maintained at 10 to 100° C. (step 412). More preferably, the wafer is maintained at a temperature in the range of 20 to 80° C. Most preferably, the wafer is maintained at a temperature in the range of 40 to 60° C.

The plasma from the etchant gas bombards the surface of the wafer, etching away the parts of the metal-containing layer that are not below the etch mask (step 414). Some of the residue from the etched away parts of the metal-containing layer redeposit on the metal-containing layer forming residual sidewall passivation. In addition, residues from the etchant gases such as carbon-based residues and other residues, which are organic in nature, deposit on the wall of the etch chamber 34. When the metal containing layer is sufficiently etched, the flow of the etchant gas is discontinued (step 416) and the etching is stopped, completing the etch cycle.

A strip cycle is then initiated. During the strip cycle, an etch mask stripping gas is then introduced into the etch chamber 34 (step 418). In the preferred embodiment of the invention the stripping gas comprises 0 to 100% argon and 0 to 100% oxygen. More preferably, the stripping gas comprises 0 to 50% argon and 50 to 100% oxygen. Most preferably, the stripping gas comprises 0 to 10% argon and 90 to 100% oxygen, for example 5% argon and 95% oxygen. In other embodiments, the stripping gas may comprise separately or mixtures of oxygen, argon, carbon tetrafluoride, helium, xenon, sulfur hexafluoride, nitrogen, hydrogen, and neon. Preferable mixtures of stripping gas may be about 70 to 80% helium with about 20 to 30% oxygen or nitrogen with hydrogen.

In the preferred embodiment, power is supplied into the stripping gas as radio frequency power, which is inductively coupled to the stripping gas to create a plasma from the stripping gas in the etch chamber (step 420). The radio frequency power energizes and ionizes the oxygen converting the oxygen to an oxygen plasma. In the preferred embodiment, the power supplied in the stripping gas is between 300 and 3,000 watts. More preferably, the power supplied to the stripping gas is between 300 and 1,500 watts. Most preferably, the power supplied in the stripping gas is between 600 and 1,000 watts. In the preferred embodiment of the invention, the amount of power pumped into the etchant gas is the same as the amount of power pumped into the stripping gas, to provide a less complex procedure. However, in other preferred embodiments the amount of power pumped into the etchant gas is different than the amount of power pumped into the stripping gas.

A bias voltage is applied to a chuck that supports the substrate, thus electrostatically attracting the plasma created from the stripping gas to the wafer (step 422). In the preferred embodiment the bias voltage is between −10 and 1,000 volts. More preferably the bias voltage is between −100 and −800 volts. Most preferably the bias voltage is between −200 and −600 volts. Since the bias voltage is dependent on various factors, it is easier to measure a bias power. In the preferred embodiment of the invention, the bias power is between 50 and 1,500 watts. More preferably the bias power is between 100 and 1,000 watts. Most preferably the bias power is between 500 and 800 watts. In the preferred embodiment of the invention, the bias voltage and the bias power used during the etching is different than the bias voltage and bias power used during the stripping. However, in other preferred embodiments the bias voltage and the bias power used during the etching is the same as the bias voltage and bias power used during the stripping.

During the stripping the wafer temperature is maintained at a preferable temperature of 10 to 100° C. (step 424). More preferably, the wafer is maintained at a temperature in the range of 20 to 80° C. Most preferably, the wafer is maintained at a temperature in the range of 40 to 60° C. In the preferred embodiment of the invention, the wafer temperature during etching is maintained at a temperature which is about equal to the wafer temperature during the stripping, to provide a less complex procedure. However, in other embodiments during etching the wafer temperature during etching is different to the wafer temperature during stripping.

The plasma created by the stripping gas strips away the etch mask, which in this example is a photoresist mask, (step 426) and most or all of the residual sidewall passivation. (step 428). The energized oxygen radical, created by the plasma source of the etch chamber, is the main component in the stripping of the organic photoresist layer. It has been found that the oxygen plasma cleans the carbon based residue from the wall of the etch chamber 34 (step 430), so that the etch chamber 34 cleans itself while the photoresist is being stripped from the wafer in the etch chamber 34. This cleaning reduces the need for additional cleaning. The flow of the stripping gas is then discontinued (step 432).

The wafer is then transferred from the etch chamber 34 (step 434) to the corrosion passivation chamber 36 (step 436). The corrosion passivation chamber 36 provides corrosion passivation by exposing the wafer to a non-plasma water vapor at a high temperature to provide corrosion protection (step 438). One aspect of the invention provides corrosion passivation without the use of a plasma source. It has been found that a non-plasma water vapor at a high temperature provides corrosion passivation with about the same throughput as corrosion passivation that utilizes a water vapor plasma from a downstream plasma source. The water vapor of the corrosion passivation chamber 36 forms HCl with chlorine residue. The high temperature drives away the HCl, removing chlorine from the aluminum surface before the chlorine reacts with the aluminum, thus providing corrosion passivation. Other embodiments may use a corrosion passivation chamber that uses a water vapor plasma.

The wafer is then transferred from the corrosion passivation chamber 36 to the cooling station 38 (step 440), where the semiconductor wafer is cooled (step 442). The semiconductor wafer is then transferred from the cooling station 38 back to the load lock 32 (step 444), so that the semiconductor wafer may be removed from the etch tool 30, while preserving the vacuum in the etch tool 30. The semiconductor wafer may then be transferred from the load lock 32 (step 446) of the etch tool 30 to a wet chemical bath 40 (step 448) where the wafer is subjected to aggressive chemicals to remove any remaining residual sidewall passivation. EKC 265 and ACT 935 are examples of chemicals that are used in a wet chemical bath to strip residual sidewall passivation. Since most or all of the residual sidewall passivation is removed in the etch chamber, the wafer would be placed in the chemical bath for a much shorter time than in the prior art. The wafer is then removed from the wet bath (step 450) and further processed to complete the device.

The processing time in the etch tool and the wet chemical bath in the preferred embodiment of the invention comprises the sum of the etch time in the etch chamber, the etch mask strip and the residual sidewall passivation removal time in the etch chamber, the corrosion passivation time in the corrosion passivation chamber, the transfer time between the etch chamber and the corrosion passivation chamber, and the time in the wet chemical bath. The etch mask strip time in the preferred embodiment using the etch chamber tends to be less than the etch mask strip time in the prior art strip chamber. The residual sidewall passivation removal time in the etch chamber of the preferred embodiment is usually much less than residual sidewall passivation in the prior art wet chemical bath. For example, the residual sidewall passivation removal time in the etch chamber of the preferred embodiment may be on the order of 30 seconds to a minute, while the residual sidewall passivation in the prior art wet chemical bath may be on the order of 20 minutes. Because the etch chamber is used to strip the residual sidewall passivation, the time in the wet chemical bath of the preferred embodiment is much less than the time in the prior art wet chemical bath. For example, in the preferred embodiment the time in the wet chemical bath may be on the order of 5 to 10 minutes, while the time in the wet chemical bath of the prior art may be on the order of 20 minutes. This shorter time in the wet chemical bath not only increases throughput, but also reduces the amount of chemicals consumed per wafer allowing less frequent replenishing of the chemicals or smaller bath sizes. The corrosion passivation time in the corrosion passivation chamber of the preferred embodiment may be of the same order of magnitude as the corrosion passivation time in the strip chamber of the prior art.

In the preferred embodiment of the invention each etch tool system 30 comprises a single load lock, a single corrosion passivation chamber, a single cooling station and at least three etch tool chambers. In another embodiment of the invention, pure oxygen is used during the etch mask strip. In addition, the use of a single gas allows for a much simpler process. In other embodiments, other additives may be used in place of argon.

In other embodiments, the etch tool would comprise a load lock, an etch chamber, and a cooling station, without a corrosion passivation chamber. In another embodiment of the invention, a wet chemical bath is not used and all of the removal of the residual sidewall passivation is done in the etch chamber. The elimination of the wet chemical bath provides a desirable dry process, eliminating the need for hazardous, slower, and expensive wet baths.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching at least partially through a metal-containing layer disposed above a substrate, wherein part of said metal-containing layer is disposed below an etch mask and part of said metal-containing layer is not disposed below the etch mask, comprising the steps of:

placing the substrate in an etch chamber;

flowing an etchant gas into the etch chamber;

creating a plasma from the etchant gas in the etch chamber;

etching away parts of the metal-containing layer not disposed below the etch mask, wherein some of the etched away parts of the metal-containing layer is redeposited to form residual sidewall passivation while the substrate is in the etch chamber;

discontinuing the flow of the etchant gas into the etch chamber;

flowing an etch mask stripping gas into the etch chamber;

creating a plasma from the etch mask stripping gas in the etch chamber;

stripping away the etch mask and removing some residual sidewall passivation, while the substrate is in the etch chamber; and removing the substrate from the etch chamber.

2. The method, as recited in claim 1, further comprising the steps of:

electrostatically attracting the plasma from the etchant gas to the substrate in the etch chamber; and electrostatically attracting the plasma from the etch mask stripping gas to the substrate in the etch chamber.

3. The method, as recited in claim 2, wherein the etch chamber is a metal etch chamber.

4. The method, as recited in claim 3, wherein the step of stripping away the etch mask and removing residual sidewall passivation further removes residue from walls of the etch chamber.

5. The method, as recited in claim 4, wherein the etch mask stripping gas comprises oxygen.

6. The method, as recited in claim 5, further comprising the steps of:

placing the substrate in a load lock; and removing the substrate from the load lock to place the substrate into the etch chamber.

7. The method, as recited in claim 6, further comprising the steps of:

placing the substrate into a corrosion passivation chamber after the substrate has been removed from the etch chamber; and exposing the wafer to a non-plasma high temperature water vapor.

8. The method, as recited in claim 7, further comprising the steps of:

transferring the substrate from the corrosion passivation chamber to a cooling station;

cooling the substrate in the cooling station; and transferring the substrate from the cooling station to the load lock.

9. The method, as recited in claim 8, further comprising the step of maintaining a pressure between 1 and 80 millitorr during the etching and stripping steps.

10. The method, as recited in claim 9, further comprising the step of maintaining the substrate at a temperature between 10° and 100° C. during the etching and stripping steps.

11. The method, as recited in claim 10, wherein the step of electrostatically attracting the plasma from the etchant gas comprises the step of biasing a chuck supporting the substrate to a bias power between −10 and −1,000 volts, and wherein the step of electrostatically attracting the plasma from the etch mask stripping gas comprises the step of biasing the chuck supporting the substrate to a bias power between −10 and −1,000 volts.

12. The method, as recited in claim 4, further comprising the step of maintaining a pressure between 1 and 80 millitorr during the etching and stripping steps.

13. The method, as recited in claim 12, further comprising the step of maintaining the substrate at a temperature between 10° and 100° C. during the etching and stripping steps.

14. The method, as recited in claim 13, wherein the step of electrostatically attracting the plasma from the etchant gas comprises the step of biasing a chuck supporting the substrate to a bias power between −10 and −1,000 volts and wherein the step of electrostatically attracting the plasma from the etch mask stripping gas comprises the step of biasing the chuck supporting the substrate to a bias power between −10 and −1,000 volts.

15. The method, as recited in claim 1, wherein the stripping away comprises accelerating oxygen plasma to the substrate to remove parts of the metal-containing layer that are redeposited to form residual sidewall passivation.

16. A method for etching at least partially through a metal-containing layer disposed above a substrate, wherein part of said metal-containing layer is disposed below an etch mask and part of said metal-containing layer is not disposed below the etch mask, comprising the steps of:

placing the substrate in the etch chamber;

etching away parts of the metal-containing layer not disposed below the etch mask, wherein some of the etched away parts of the metal-containing layer is redeposited to form residual sidewall passivation on the substrate, while the substrate is in the etch chamber;

stripping away the etch mask and removing some sidewall passivation while the substrate is in the etch chamber; and removing the substrate from the etch chamber.

* * * * *